US010174245B2

United States Patent
Pohl-Klein et al.

(10) Patent No.: US 10,174,245 B2
(45) Date of Patent: Jan. 8, 2019

(54) METHOD FOR PRODUCING A LUMINESCENT MATERIAL, LUMINESCENT MATERIAL AND OPTOELECTRONIC COMPONENT

(71) Applicant: OSRAM Opto Semiconductors GmbH, Regensburg (DE)

(72) Inventors: Bianca Pohl-Klein, Gilching (DE); Daniel Bichler, Munich (DE); Raquel de la Peña Alonso, Neubiberg (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 341 days.

(21) Appl. No.: 14/891,596

(22) PCT Filed: Apr. 30, 2014

(86) PCT No.: PCT/EP2014/058882
§ 371 (c)(1),
(2) Date: Nov. 16, 2015

(87) PCT Pub. No.: WO2014/184003
PCT Pub. Date: Nov. 20, 2014

(65) Prior Publication Data
US 2016/0122637 A1 May 5, 2016

(30) Foreign Application Priority Data
May 16, 2013 (DE) .................. 10 2013 105 056

(51) Int. Cl.
*C09K 11/77* (2006.01)
*H01L 33/50* (2010.01)

(52) U.S. Cl.
CPC ........ *C09K 11/7734* (2013.01); *H01L 33/502* (2013.01); *H01L 33/504* (2013.01);
(Continued)

(58) Field of Classification Search
CPC .......... C09K 11/7721; C09K 11/77347; C09K 11/7749; C09K 11/7758; C09K 11/7764; C09K 11/7774; C09K 11/7792
See application file for complete search history.

(56) References Cited

U.S. PATENT DOCUMENTS 7,144,524 B2  12/2006  Sakata et al.
7,262,439 B2  8/2007  Setlur et al.
(Continued)

FOREIGN PATENT DOCUMENTS

CN  101044222 A  9/2007
CN  102041002 A  5/2011
(Continued)

OTHER PUBLICATIONS

Park, W.B. et al.: "Eu2+ Luminescence From 5 Different Crystallographic Sites in a Novel Red Phosphor Ca15Si20O10N30:Eu2+," Journal of Materials Chemistry, May 11, 2012, pp. 14068-14075, vol. 22.
(Continued)

Primary Examiner — Matthew E. Hoban
(74) Attorney, Agent, or Firm — Slater Matsil, LLP (57) ABSTRACT

A method for producing a luminescent material includes producing a mixture of starting substances, wherein the starting substances have a first component and a second component. The first component is selected from a group that comprises aluminum, silicon, at least one element of the 2nd main group of the periodic table and at least one element of the lanthanides and combinations thereof. The second component comprises oxygen and/or nitrogen. The method also includes annealing the mixture at a temperature of at least 1300° C. in a reducing atmosphere. After method the annealing, at least one or several phases are obtained. At least one phase comprises a luminescent material. The luminescent material absorbs at least a portion of an elec-
(Continued)

tromagnetic primary radiation in the UV or blue range and emits an electromagnetic secondary radiation with an emission maximum of greater than or equal to 600 nm.

7 Claims, 5 Drawing Sheets

(52) U.S. Cl.
CPC ............... *H01L 2224/48091* (2013.01); *H01L 2224/48247* (2013.01); *H01L 2224/73265* (2013.01)

(56) References Cited

U.S. PATENT DOCUMENTS

| | | | |
|---|---|---|---|
| 7,432,647 B2 | 10/2008 | Nagatomi et al. | |
| 7,540,977 B2 | 6/2009 | Hirosaki et al. | |
| 7,713,443 B2 | 5/2010 | Hirosaki et al. | |
| 7,791,265 B2 | 9/2010 | Fiedler et al. | |
| 7,825,580 B2 | 11/2010 | Hirosaki et al. | |
| 8,153,023 B2 | 4/2012 | Shioi | |
| 8,409,470 B2 | 4/2013 | Hirosaki et al. | |
| 8,896,006 B2 | 11/2014 | Becker et al. | |
| 2007/0007494 A1 | 1/2007 | Hirosaki et al. | |
| 2008/0143246 A1* | 6/2008 | Hirosaki | C04B 35/597 313/503 |
| 2009/0212683 A1* | 8/2009 | Fiedler | C09K 11/0883 313/498 |
| 2010/0102704 A1 | 4/2010 | Jermann et al. | |
| 2011/0096560 A1 | 4/2011 | Ryu et al. | |
| 2011/0180780 A1 | 7/2011 | Yoo et al. | |
| 2012/0037938 A1 | 2/2012 | Becker et al. | |
| 2012/0140438 A1 | 6/2012 | Winkler et al. | |
| 2013/0147342 A1 | 6/2013 | Won et al. | |
| 2014/0133146 A1 | 5/2014 | Ryu et al. | |

FOREIGN PATENT DOCUMENTS

| | | |
|---|---|---|
| CN | 103146378 A | 6/2013 |
| DE | 602004000795 T2 | 1/2007 |
| DE | 112006001722 T5 | 5/2008 |
| DE | 112006003161 T5 | 10/2008 |
| DE | 102007033026 A1 | 1/2009 |
| DE | 112007001645 T5 | 5/2009 |
| DE | 102012111876 A | 6/2013 |
| EP | 1669429 A2 | 6/2006 |
| EP | 1806389 A1 | 7/2007 |
| JP | 2005226000 A | 8/2005 |
| JP | 2006206729 A | 8/2006 |
| JP | 2008189700 A | 8/2008 |
| JP | 2009519364 A | 5/2009 |
| JP | 2012509373 A | 4/2012 |
| KR | 20110130256 A | 12/2011 |
| WO | 2005052087 A1 | 6/2005 |
| WO | 2006033418 A1 | 3/2006 |
| WO | 2011028033 A2 | 3/2011 |

OTHER PUBLICATIONS

Wang, X. et al., "Promising Oxonitridosilicate Phosphor Host Sr2Si2O4N2: Synthesis, Structure, and Luminescence Properties Activated by Eu2+ and Ce3+/Li+ for pc-LEDs," Inorganic Chemistry, vol. 51, No. 6, Feb. 29, 2012, pp. 3540-3547.
"Tristrontium Dialuminium Oxide (Al2O6Sr3)," Datasheet, FIZ Karlsruhe Inorganic Crystal Stucture Database (ICSD), Retrieval date: Jul. 19, 2013, 4 pages.
Chakoumakos, B.C., et al., "Refinement of the Structures of Sr3Al2O6 and the Hydrogarnet Sr3Al2(O4D4)3 by Rietveld Analysis of Neutron Powder Diffraction Data," Acta Crystallographica Section C: Structural Chemistry, C48, Mar. 15, 1992, pp. 414.
Shin, H.H., et al., "Reduction from Eu3+ to Eu2+ in Sr3Al2O6:Eu phosphor and luminescent properties," The Electrochemical Society, 213th ECS Meeting, Abstract #12, Jan. 2008, 1 page.
"New alloys and compounds research reported from Tianjin University," Vertical News Insurance, Jun. 23, 2008, 1 page.
Zhang, P., et al., "The new red luminescent Sr3Al2O6:Eu2+ phosphor powders synthesized via sol-gel route by microwave-assisted," Journals of Alloys and Compounds, vol. 456, Feb. 6, 2007, pp. 216-219.

* cited by examiner

METHOD FOR PRODUCING A LUMINESCENT MATERIAL, LUMINESCENT MATERIAL AND OPTOELECTRONIC COMPONENT

This patent application is a national phase filing under section 371 of PCT/EP2014/058882, filed Apr. 30, 2014, which claims the priority of German patent application 10 2013 105 056.5, filed May 16, 2013, each of which is incorporated herein by reference in its entirety.

TECHNICAL FIELD

The present invention relates to a method for producing a luminescent material, to a luminescent material and to an optoelectronic component.

BACKGROUND

Radiation-emitting components, such as light-emitting diodes (LEDs), for example, often contain luminescent materials in order to convert the radiation emitted by a radiation source into a radiation having an altered, usually longer, wavelength. In this case, the efficiency of the luminescent material is dependent inter alia on its position of the absorption maximum in relation to the wavelength range of the primary electromagnetic radiation and/or on the position of its emission maximum. In particular, in the case of radiation-emitting components which emit warm-white light, high-efficiency luminescent materials are required which have an emission of electromagnetic radiation in the red range, for example in the range of greater than or equal to 600 nm.

SUMMARY

Embodiments of the present invention specify a method for producing a luminescent material, a luminescent material and an optoelectronic component which has an improved efficiency.

DETAILED DESCRIPTION OF ILLUSTRATIVE EMBODIMENTS

Advantages and advantageous embodiments and developments of the subject matter according to the invention will become apparent from the exemplary embodiments described in more detail below and in association with the figures.

In accordance with one embodiment, a method for producing a luminescent material comprises the following method steps:

A) producing a mixture of starting substances,
wherein the starting substances comprise a first constituent and a second constituent,
wherein the first constituent comprises or consists of the following:
at least one element of the 2nd main group of the periodic system and/or zinc, wherein the proportion of the element of the 2nd main group and/or zinc in the first constituent is greater than or equal to 45 mol % and less than or equal to 85 mol %,
aluminum, wherein the proportion of the aluminum in the first constituent is greater than or equal to 0 mol % and less than or equal to 40 mol %,
silicon, wherein the proportion of the silicon in the first constituent is greater than or equal to 0 mol % and less than or equal to 35 mol %,
at least one element of the lanthanides and/or $Mn^{2+}$ and/or $Mn^{4+}$, wherein the proportion of the element of the lanthanides and/or $Mn^{2+}$ and/or $Mn^{4+}$ in the first constituent is greater than or equal to 0.001 mol % and less than or equal to 20 mol %,
wherein the second constituent comprises or consists of the following:
oxygen, wherein the proportion of the oxygen in the second constituent is greater than or equal to 0 mol % and less than or equal to 100 mol %,
nitrogen, wherein the proportion of the nitrogen in the second constituent is greater than or equal to 0 mol % and less than or equal to 100 mol %, B) annealing the mixture at a temperature of at least 1300° C. under a reducing atmosphere,
wherein at least one or a plurality of phases are obtained after method step B),
wherein at least one phase comprises a luminescent material (6),
wherein the luminescent material (6) absorbs at least part of a primary electromagnetic radiation in the UV or blue range and emits a secondary electromagnetic radiation having an emission maximum of greater than or equal to 660 nm, in particular greater than or equal to 700 nm.

In addition, the method can comprise a further method step C): C) grinding and/or screening the mixture. Method step C) can be carried out after method step B).

In accordance with at least one embodiment, method steps B) and/or C) can be repeated. In particular, method steps B) and/or C) can be repeated from one to five times, for example, twice.

Particularly highly efficient and long-wave emitting luminescent materials can be produced by the method mentioned above.

Here and hereinafter, "first constituent" denotes elements of the periodic system, such as, for example, strontium, calcium, barium, silicon, aluminum, manganese, lanthanides, such as europium, which are present as cation (for example, $Sr^{2+}$, $Ba^{2+}$, $Ca^{2+}$, $Si^{4+}$, $Al^{3+}$, $Mn^{2+}$, $Mn^{4+}$, $Eu^{2+}$) freely or bound in a chemical compound, for example, at least one starting substance. Bound as cation in a chemical compound does not mean that the element of the periodic system is present as free electrically charged atom or molecule (having at least one ionic charge) in the chemical compound. Alternatively or additionally, the first constituent can comprise elements of the periodic system which are uncharged or are present in elemental form. In this regard, for example, the first constituent can comprise metals, for example, strontium, aluminum and/or europium, or semi-metals, for example, silicon.

In accordance with at least one embodiment, the elements of the 2nd main group are selected from the following group or combinations thereof: magnesium (Mg), calcium (Ca), strontium (Sr) and barium (Ba). In particular, the element of the 2nd main group is selected from the following group: strontium, barium, calcium and combinations thereof.

In accordance with at least one embodiment, instead of at least one element of the 2nd main group alternatively or additionally zinc can be present.

In accordance with at least one embodiment, the proportion of the silicon in the first constituent is greater than or equal to 15 mol % and less than or equal to 35 mol %, for example, 30 mol %.

In accordance with at least one embodiment, the first constituent comprises a combination of at least one element of the 2nd main group, aluminum, silicon and an element of the lanthanides. In this context, a "combination of at least one element of the 2nd main group, aluminum, silicon and an element of the lanthanides" in relation to the first constituent means that the first constituent of the mixture of the starting substances contains an element of the 2nd main group, aluminum, silicon and an element of the lanthanides, wherein the sum of the proportions of these elements or cations is 100% or 100 mol % if the first constituent contains no further elements, or less than 100% or 100 mol % if, besides at least one element of the 2nd main group, aluminum, silicon and an element of the lanthanides, even further elements form the first constituent.

At least one element of the lanthanides and/or $Mn^{2+}$ and/or $Mn^{4+}$ acts here as activator or dopant. In this case, the activator can be incorporated into the crystal lattice. The activator can be selected from a group comprising lanthanum, cerium, praseodymium, neodymium, promethium, samarium, europium, gadolinium, terbium, dysprosium, holmium, erbium, thulium, ytterbium and lutetium. In particular, the activator is europium, cerium, $Mn^{2+}$ and/or $Mn^{4+}$. Upon substitution of divalent elements by trivalent elements, for example, $Ce^{3+}$, there is no charge neutrality. Therefore, charge compensation is generally necessary. The charge compensation can be effected in particular by means of the Al—Si—O—N ratio. The concentration of the activator in the luminescent material can be 0.001 to 20 mol %, in particular 0.1 to 5 mol %, for example, 2 mol %.

An element of the lanthanides can substitute an element of the 2nd main group.

In this context "proportion of the element of the 2nd main group" means the substance amount proportion in percent with the unit mol % of the element of the 2nd main group, for example, of the strontium, relative to the total proportion of the first constituent.

"Proportion of the element of the lanthanides" or "proportion of the aluminum" or "proportion of the silicon" correspondingly denotes the substance amount proportion in percent with the unit mol % of the respective element (element of the lanthanides or aluminum or silicon) relative to the total proportion of the first constituent. Here and hereinafter, "total proportion of the first constituent" denotes the sum of all proportions of the respective elements in the first constituent.

In accordance with at least one embodiment, the proportion of the element of the 2nd main group in the first constituent is preferably greater than or equal to 45 mol % and less than or equal to 85 mol %, for example, 50 mol %.

In accordance with at least one embodiment, the proportion of the aluminum in the first constituent is preferably greater than or equal to 0 mol % and less than or equal to 40 mol %, for example, 20 mol %.

In accordance with at least one embodiment, the proportion of the silicon in the first constituent is preferably greater than or equal to 20 mol % and less than or equal to 30 mol %, for example, 25 mol %.

In accordance with at least one embodiment, the proportion of the silicon in the first constituent is preferably greater than or equal to 15 mol % and less than or equal to 35 mol %, for example, 20 mol %.

"Second constituent" correspondingly denotes elements of the periodic system, such as nitrogen, chlorine and oxygen, which are present as anion, for example, as oxide anion ($O^{2-}$), chloride anion ($Cl^-$), and/or sulfide anions ($S^{2-}$), in a chemical compound, for example, at least one starting substance. Bound as anion in a chemical compound does not mean that the element of the periodic system is present as free electrically charged atom or molecule (having at least one ionic charge) in the chemical compound. Alternatively or additionally, the second constituent can comprise elements of the periodic system which are uncharged or are present in elemental form, for example, as nitrogen ($N_2$), oxygen ($O_2$), chlorine ($Cl_2$) and fluorine ($F_2$).

In this context, "proportion of oxygen" or "proportion of nitrogen" denotes the substance amount proportion in percentage with the unit mol % of the nitrogen or oxygen relative to the total amount of the second constituent.

In particular, in accordance with one embodiment, at least oxygen or nitrogen is present as second constituent. If, in accordance with one embodiment, the proportion of nitrogen is 0 mol %, then the proportion of oxygen is greater than 0 mol %, and vice versa.

In accordance with at least one embodiment, the proportion of the nitrogen in the second constituent is preferably greater than or equal to 0 mol % and less than or equal to 100 mol %, in particular greater than or equal to 30 mol % and less than or equal to 70 mol %, for example, 60 mol %.

In accordance with at least one embodiment, the proportion of the oxygen in the second constituent is preferably greater than or equal to 0 mol % and less than or equal to 100 mol %, in particular between greater than or equal to 10 mol % and less than or equal to 50 mol %, for example, 40 mol %.

The quantitative ratio of first constituent to second constituent can be controlled via the weighing-in of the starting substances.

The starting substances can be proportionally oxidized, i.e., for example, $Si_3N_4$ or AlN can contain corresponding amounts of surface area bound oxygen ($O_2$). This is not taken into account in the weighing-in of the starting substances.

In accordance with at least one embodiment, the second constituent comprises oxygen and nitrogen. In this case, the sum of the proportions of nitrogen and oxygen is 100% or 100 mol % if the second constituent contains no further elements, or less than 100% or 100 mol % if, besides nitrogen and oxygen, further elements are also used for the second constituent.

The ranges indicated here for the proportions of the elements in the first constituent and respectively the proportions of the elements in the second constituent can be combined with one another arbitrarily in this case in accordance with the above description, such that a mixture of the starting substances can be produced from an arbitrary combination of the proportions of the individual elements, even if this combination is not explicitly mentioned here.

In accordance with at least one embodiment, at least one element of the first constituent and an element of the second constituent are chemically bound in a starting substance. By way of example, the first constituent aluminum and the second constituent nitrogen are present as starting substance aluminum nitride and/or the first constituent strontium as an element of the 2nd main group and the second constituent nitrogen are present as starting substance strontium nitride. In accordance with a further embodiment, the starting substance can comprise further elements besides the first and second constituents. This will be elucidated using the starting substance strontium carbonate, wherein, besides strontium as first constituent and oxygen as second constituent, carbon can be present as a further element in the starting substance.

In accordance with at least one embodiment, the mixture of the starting substances comprises hydrides, carbonates, nitrides, oxides, metals, alloys and/or silicides of the lanthanides, elements of the 2nd main group of the periodic system, elements of the 3rd main group of the periodic system, elements of the 4th main group of the periodic system and/or combinations thereof. Furthermore, chlorides, fluorides, sulfates, phosphates, nitrates and combinations thereof can be used as a mixture of the starting substances. The first constituent can comprise strontium, barium, calcium, aluminum, europium and/or silicon in elemental form.

A sufficient homogenization by mixing of the starting substances is required for the synthesis. During the mixing of the starting substances in method step A), the conditions can be chosen such that enough energy is input into the material to be mixed, thus resulting in grinding of the starting substances. The resulting increased homogeneity and reactivity of the mixture can have a positive influence on the properties of the resulting luminescent material.

In accordance with one embodiment, the homogenization in method step A) can be carried out over a period of time comprising 1 minute to 24 hours, in particular between 1 hour and 8 hours, for example, 3 hours. A homogeneous mixing or blending can be ensured as a result.

The starting substances can be weighed in stoichiometrically. Alternatively, the starting substances can also be weighed in non-stoichiometrically, wherein at least one starting substance can be weighed in with an excess, in order to compensate for possible evaporation losses during production. By way of example, starting substances comprising elements of the 2nd main group can be weighed in with an excess.

Starting substances can be selected from a group comprising elements of the 2nd main group and their compounds, silicon and its compound or compounds, aluminum and its compound or compounds, and/or lanthanides and its compound or compounds.

In this case, compounds comprising at least one element of the 2nd main group can be selected from alloy, hydrides, silicides, nitrides, halides, oxides, amides, amines, carbonates and metals and mixtures of this compound. Strontium carbonate and/or strontium nitride are/is preferably used.

A silicon compound can be selected from alloys, silicon nitrides, alkaline earth metal silicides, silicon diimides, silicon hydrides, silicon oxide and silicon or mixtures of this compound. Silicon nitride and/or silicon oxide are/is preferably used, these being stable, readily available and expedient.

An aluminum compound can be selected from alloys, oxides, nitrides and aluminum and mixtures of this compound or these compounds. Aluminum oxide and/or aluminum nitride are/is preferably used, these being stable, readily available and expedient.

Compounds from the group of the lanthanides, for example, compounds of europium, and/or $Mn^{2+}$ and/or $Mn^{4+}$ can be selected from oxides, nitrides, halides, hydrides, metals or mixtures of these compounds and/or metals. Europium oxide and/or halides are preferably used, these being stable, readily available and expedient.

In accordance with at least one embodiment, in method step A) a flux is additionally added. Alternatively, a flux can also be dispensed with in method step A). The flux can be used for improving the crystallinity and for supporting the crystal growth of the resulting luminescent material. Secondly, the reaction temperature or annealing temperature can be reduced by the addition of the flux. The starting substances can be homogenized with the flux. Alternatively or additionally, the flux can also be added after the first annealing of the mixture of the starting substances. The homogenization can be carried out, for example, in a mortar mill, a ball mill, a turbulent mixer, a plowshare mixer or by means of other suitable methods.

By targeted variation of the bulk density and/or by modification of the agglomeration of the mixture of the starting substance, the production of secondary phases can be reduced. Moreover, the particle size distribution, particle morphology and the yield of the resulting luminescent material can be influenced. The techniques suitable in this case are, for example, residue-free screenings and granulation, if appropriate using suitable additives.

The inventors have discovered that by mixing the starting substances with corresponding proportions of the elements in the first constituent and second constituent, it is possible to produce at least one phase comprising the luminescent material. The luminescent material can be present with phase purity or in a mixture together with further phases. With phase purity means that only the luminescent material is contained in one phase. In particular, the other phases, which do not comprise the luminescent material, are free of materials or luminescent materials that are capable of emitting secondary electromagnetic radiation. Therefore, only the phase comprising luminescent material is capable of emitting secondary electromagnetic radiation.

In accordance with at least one embodiment, the phase or phases not comprising the luminescent material emit no secondary electromagnetic radiation having a wavelength range of greater than 460 nm.

The mixture of the starting substances is heated to at least 1300° C. under a reducing atmosphere. The resulting luminescent material emits secondary electromagnetic radiation in the red or deep-red range. The luminescent material has a high stability, quantum efficiency, conversion efficiency and low thermal quenching.

Under a reducing atmosphere can be understood to mean, for example, an inert or a reducing atmosphere. A reducing atmosphere does not preclude oxygen being present in the reducing atmosphere.

In the method, the annealing in method step B) is carried out at a temperature of between 1300° C. and 2000° C. inclusive. In accordance with at least one embodiment, method step B) is carried out at a temperature of 1400° C. to 1700° C., for example, 1450° C. The selection of the temperature makes it possible to produce the red-emitting luminescent material with a high efficiency. The temperature here denotes the maximum temperature or the maximum synthesis temperature in method step B).

In the method, the annealing in method step B) is carried out at least once. In particular, the annealing in method step B) can be carried out from one to five times, in particular one to three times, for example, twice.

Multiple annealing of the starting substances with or without an interposed post-processing process, such as grinding and/or screening, for example, can further improve the crystallinity or the grain size distribution of the luminescent material. Further advantages can be a lower defect density in association with improved optical properties of the resulting luminescent material and/or a higher stability of the resulting luminescent material. After the last annealing carried out, the mixture can be ground and screened.

Occasionally, in accordance with one embodiment, it is possible to carry out short heat treatment steps in air at low T<600° C.

In accordance with at least one embodiment, a holding time selected from the range of one minute to 24 hours is complied with during the annealing in method step B). In particular, the holding time is selected from the range of one hour to eight hours, for example, from the range of one hour to four hours, for example, two hours. Holding times should be understood to mean the time during which the maximum temperature is maintained. The holding time together with the heating time and cooling time yields the total annealing duration.

The longer the holding time in general, the more coarse grained the resulting luminescent material.

The annealing can take place in a crucible composed of tungsten, molybdenum, corundum, graphite or boron nitride, for example. In this case, the crucible can have a lining composed of molybdenum, for example, or a lining composed of sapphire. The annealing can be carried out in a gas-tight furnace under a reducing atmosphere and/or inert gas, such as, for example, in hydrogen, ammonia, argon, nitrogen or mixtures thereof. The atmosphere can be flowing or stationary. It can additionally be advantageous for the quality of the resulting luminescent material if elemental carbon in finely divided form is present in the furnace chamber. Alternatively, it is possible to introduce carbon directly into the mixture of the starting substances or starting materials.

In accordance with a further embodiment, the additional method step D) or further method steps can be carried out after method step B) or C). This is the case particularly if the luminescent material was not obtained with phase purity and/or was obtained in a contaminated manner.

In accordance with at least one embodiment, a method step D) follows method step B) and/or C). In method step D), the luminescent material can be isolated by chemical after treatment. The luminescent material can be isolated by washing in alkaline solution and/or acid. The acid can be selected, for example, from a group comprising hydrochloric acid, sulfuric acid, nitric acid, hydrofluoric acid, organic acids and mixtures thereof. The alkaline solution can be selected from a group comprising potassium hydroxide solution, sodium hydroxide solution and mixtures thereof. Such washings can increase the efficiency when a luminescent material is produced. Furthermore, as a result, secondary phases, vitreous phases or other impurities can be removed and an improvement in the optical properties of the luminescent material can be achieved, provided that they are soluble in the alkaline solution and/or acid.

The ground powder from method step B) or C) can be subjected to further fractionating and classifying steps, such as, for example, screening, flotation or sedimentation.

Furthermore, a luminescent material produced by a method in accordance with the above explanations is specified.

In this case, all embodiments and definitions which were presented above in the description of the general part and were described for the method for producing a luminescent material are applicable to the luminescent material.

Here and hereinafter, "luminescent material" denotes a material which at least partly absorbs primary electromagnetic radiation and emits it as secondary electromagnetic radiation in a wavelength range that at least partly differs from the primary electromagnetic radiation. Here and hereinafter, the luminescent material can also be designated as conversion material.

Primary electromagnetic radiation and/or secondary electromagnetic radiation can comprise one or a plurality of wavelengths and/or wavelength ranges in an infrared to ultraviolet wavelength range, in particular in a wavelength range of between approximately 185 nm and 900 nm, preferably between approximately 350 nm and 900 nm. In this case, the spectrum of the primary electromagnetic radiation and/or the spectrum of the secondary electromagnetic radiation can be narrowband, that is to say that the primary electromagnetic radiation and/or the secondary electromagnetic radiation can have a single-colored or approximately single-colored wavelength range. The spectrum of the primary electromagnetic radiation and/or the spectrum of the secondary electromagnetic radiation can alternative also be broadband, that is to say that the primary electromagnetic radiation and/or the secondary electromagnetic radiation can have a mixed-colored wavelength range, wherein the mixed-colored wavelength range can in each case have a continuous spectrum or a plurality of discrete spectral components at different wavelengths. In particular, the secondary electromagnetic radiation is broadband and has a full width at half maximum of greater than or equal to 100 nm.

In accordance with one embodiment, at least the luminescent material can convert primary electromagnetic radiation from one or a plurality of wavelengths or wavelength ranges from the UV to the blue range. By way of example, the primary electromagnetic radiation can be generated by a light-emitting diode or a laser.

Here and hereinafter, color indications in relation to emitting luminescent materials or electromagnetic radiation denote the respective spectral range of the electromagnetic radiation, for example, of the primary electromagnetic radiation or secondary electromagnetic radiation.

In accordance with a further embodiment, at least the luminescent material converts primary electromagnetic radiation that is within a wavelength range of 185 to 600 nm, preferably of 360 to 470 nm.

In accordance with one embodiment, the luminescent material converts primary electromagnetic radiation suitable for exciting it.

The secondary electromagnetic radiation of the luminescent material can have an emission maximum in the wavelength range of greater than 660 nm, particularly of greater than 700 nm, for example, 707 nm. Therefore, the luminescent material has a secondary electromagnetic radiation having an emission maximum which is in the deep-red spectral range of the electromagnetic radiation. Moreover the resulting luminescent material has a high efficiency.

The luminescent material can have an emission spectrum which is characterized by an emission maximum of greater than or equal to 660 nm with a full width at half maximum of greater than or equal to 100 nm, for example, 110 nm.

In accordance with one embodiment, the luminescent material can be present as a secondary phase or main phase of the reaction produces or with phase purity. In particular, the luminescent material is present as a main phase of the reaction products or with phase purity. In this context, "main phase" should be understood to mean a reaction product having the largest proportion relative to the total proportion of all the reaction products. "Secondary phase" denotes all reaction products that are not a main phase.

In accordance with at least one embodiment, the luminescent material comprises a first luminescent material constituent and a second luminescent material constituent. The first luminescent material constituent comprises or consists of aluminum, at least one element of the 2nd main group of the periodic system and at least one element of the lanthanides and/or $Mn^{2+}$ and/or $Mn^{4+}$. In particular, the first luminescent material constituent additionally comprises silicon or consists of aluminum, silicon, at least one element of the 2nd main group and at least one element of the lanthanides and/or $Mn^{2+}$ and/or $Mn^{4+}$. In particular, the first luminescent material constituent comprises or consists of silicon, at least one element of the 2nd main group of the periodic system and at least one element of the lanthanides and/or $Mn^{2+}$ and/or $Mn^{4+}$. The second luminescent material constituent comprises at least oxygen or nitrogen. In particular, the second luminescent material constituent additionally comprises nitrogen or consists of oxygen and nitrogen.

Alternatively, the first luminescent material constituent comprises only silicon, at least one element of the 2nd main group and at least one element of the lanthanides.

In accordance with at least one embodiment, the second luminescent material constituent consists of oxygen and nitrogen. The above-explained definitions for the first and second constituents correspondingly hold true here for the first and second luminescent material constituents. In this case, the first and second luminescent material constituents relate to the composition of the luminescent material rather than—like the first and second constituents—to the starting substances or mixture of the starting substances.

In accordance with at least one embodiment, the proportions of the corresponding elements (aluminum, silicon, etc.) in the first luminescent material constituent are different than the proportions of the corresponding elements in the first constituent of the mixture of the starting substances. This can correspondingly hold true for the second luminescent material constituent.

In particular, the elements of the 2nd main group can be substituted by the elements of the lanthanides and/or $Mn^{2+}$ and/or $Mn^{4+}$.

In accordance with at least one further embodiment, the luminescent material has an emission maximum at 700+/−10 nm.

In accordance with at least one further embodiment, the luminescent material has the following general composition:

$$(EA_{1-a}LA_a)_{3-x}(Al_bSi_{1-b})_2(O_cN_{1-c})_{6-y}$$

wherein EA is at least one element from the 2nd main group and LA is at least one element from the group of the lanthanides and/or $Mn^{2+}$ and/or $Mn^{4+}$,
wherein it holds true that: $0 \leq a \leq 1$ and $0 \leq b \leq 1$ and $0 \leq c \leq 1$ and $x \leq 3$ and $y \leq 6$. In particular, EA is strontium and/or LA is europium.

In particular the following holds true for the above general composition: $0 < a < 1$ and $0 \leq b < 1$ and $0 \leq c < 1$ and $x \leq 3$ and $y \leq 6$. Therefore, the luminescent material comprises as first luminescent material constituent at least one element from the 2nd main group, for example, strontium, and at least one element from the group of the lanthanides, for example, europium.

In accordance with at least one further embodiment, the following holds true for the above general composition: $0 < a < 1$ and $0 < b < 1$ and $0 < c < 1$ and $x \leq 3$ and $y \leq 6$. Therefore, the luminescent material comprises as first luminescent material constituent at least one element from the 2nd main group, for example, strontium, at least one element from the group of the lanthanides, for example, europium, aluminum and strontium. As second constituent, the luminescent material comprises oxygen and nitrogen.

In accordance with at least one further embodiment, the luminescent material has the general composition $(Sr_{1-a}Eu_a)_{3-x}(Al_bSi_{1-b})_2(O_cN_{1-c})_{6-y}$ where $0 < a < 1$ and $0 \leq b < 1$ and $0 \leq c < 1$ and $x \leq 3$ and $y \leq 6$.

In accordance with at least one further embodiment, the luminescent material has the general composition $(Sr_{1-a}Eu_a)_{3-x}(Al_bSi_{1-b})_2(O_cN_{1-c})_{6-y}$ where $0 < a < 1$ and $0 < b < 1$ and $0 < c < 1$ and $x \leq 3$ and $y \leq 6$.

In accordance with one embodiment, a, b, c, x and/or y values in the above structural formulae of the luminescent material can be non-integral values.

In this case, the luminescent material need not necessarily have a mathematically exact composition according to the above formulae. Rather, they can comprise for example, one or a plurality of additional dopants and additional constituents. For the sake of simplicity, however, the above formulae only include the essential constituents.

The luminescent material possibly also has a different empirical formula which hitherto has not yet been able to be identified or assigned.

In accordance with at least one further embodiment, the x-ray powder diffractogram of the luminescent material can be described in the cubic space group $Pa\overline{3}$. The refined lattice parameter fluctuates between 15.5 Å to 15.9 Å depending on the composition. The luminescent material described is structurally related to $Sr_3Al_2O_6$ (ICSD 71860). The crystallographic space groups are sufficiently known to a person skilled in the art and therefore will not be explained in greater detail at this juncture. The space group or crystal class can be determined by means of x-ray diffractometry.

In accordance with one embodiment, the luminescent material can be present not only as a powder but also as ceramic or in a manner embedded into glass or some other matrix.

Furthermore, an optoelectronic component is specified which comprises the luminescent material whose production was described above, wherein the optoelectronic component provides a beam path of the primary electromagnetic radiation, wherein the luminescent material is arranged in the beam path.

In this case, all embodiments and definitions of the method for producing a luminescent material and of the luminescent material that were presented above in the description of the general part are applicable to the optoelectronic component.

It should be pointed out at this juncture that the term "component" here should be understood to mean not only finished components, such as light-emitting diodes (LEDs) or laser diodes, for example, but also substrates and/or semiconductor layers, such that, for example, a composite of a copper layer and a semiconductor layer can already constitute a component and can form part of a superordinate second component in which, for example, electrical connections are additionally present. The optoelectronic component according to the invention can be, for example, a thin-film semiconductor chip, in particular a thin-film light-emitting diode chip.

In accordance with one embodiment, the optoelectronic component can comprise a layer sequence. In this context, "layer sequence" should be understood to mean a layer sequence comprising more than one layer, for example, a sequence of a p-doped and an n-doped semiconductor layer, wherein the layers are arranged one above another. The layer sequence can emit the primary electromagnetic radiation which can be absorbed by the luminescent material arranged in the beam path.

In accordance with one embodiment, the layer sequence can be a semiconductor layer sequence, wherein the semiconductor materials occurring in the semiconductor layer sequence are not restricted provided that they have electroluminescence at least in part. By way of example, use is made of compounds composed of the elements selected from indium, gallium, aluminum, nitrogen, phosphorus, arsenic, oxygen, silicon, carbon and combinations thereof. However, it is also possible to use other elements and additives. The layer sequence having an active region can be based on nitride compound semiconductor materials, for example. In the present context "based on nitride compound semiconductor material" means that the semiconductor layer sequence or at least one part thereof comprises or consists of a nitride compound semiconductor material, preferably $Al_nGa_mIn_{1-n-m}N$, wherein $0 \leq n \leq 1$, $0 \leq m \leq 1$ and $n+m \leq 1$. In this case, this material need not necessarily have a mathematically exact composition according to the above formula. Rather, it can comprise, for example, one or a plurality of dopants and additional constituents. For the sake of simplicity, however, the above formula includes only the essential constituents of the crystal lattice (Al, Ga, In, N) even if these can be replaced and/or supplemented in part by small amounts of further substances.

The semiconductor layer sequence can comprise as active region, for example, a conventional pn junction, a double heterostructure, a single quantum well structure (SQW structure) or a multi quantum well structure (MQW structure). Besides the active region, the semiconductor layer sequence can comprise further functional layers and functional regions, for instance p- or n-doped charge carrier transport layers, that is to say electron or hole transport layers, p- or n-doped confinement or cladding layers, buffer layers and/or electrodes and combinations thereof. Such structures concerning the active region or the further functional layers and regions are known to the person skilled in the art in particular with regard to construction, function and structure and therefore will not be explained in any greater detail at this juncture.

Alternatively, it is possible to select an organic light-emitting diode (OLED) as optoelectronic component, wherein, for example, the primary electromagnetic radiation emitted by the OLED is converted into a secondary electromagnetic radiation by a conversion material or luminescent material situated in the beam path of the primary electromagnetic radiation.

In accordance with a further embodiment, during the operation of the optoelectronic component, the primary electromagnetic radiation is emitted by the layer sequence having an active region and impinges on the luminescent material, which is arranged in the beam path of the primary electromagnetic radiation and is suitable for at least partly absorbing the primary electromagnetic radiation and emitting it as secondary electromagnetic radiation having a wavelength range that differs at least partly from the primary electromagnetic radiation.

In accordance with one embodiment, the optoelectronic component can comprise, besides the luminescent material according to the invention, a further luminescent material, which emits a further secondary electromagnetic radiation.

In accordance with a further embodiment, the entire secondary electromagnetic radiation can be composed of a secondary electromagnetic radiation emitted by the luminescent material and at least one further secondary electromagnetic radiation emitted by the further luminescent material. The further secondary electromagnetic radiation can have a wavelength in the range of 490 nm to 680 nm, e.g. 560 nm. The secondary electromagnetic radiation can have a wavelength maximum that is greater than or equal to 660 nm, preferably greater than or equal to 700 nm, for example 705 nm. The luminescent material thus emits in the red spectral range of the electromagnetic radiation and the further luminescent material emits in the yellow or green spectral range of the electromagnetic radiation. In principle, any luminescent materials can be used as further luminescent materials that are capable of emitting radiation in the yellow or green spectral range.

In accordance with a further embodiment, the optoelectronic component has a total emission composed of primary electromagnetic radiation and the entire secondary electromagnetic radiation.

In particular, in this case, the total emission can be perceived as warm-white light by an external observer during the operation of the optoelectronic component.

Alternatively, it is possible that, besides the luminescent material according to the invention, no further luminescent material is present in the optoelectronic component. As a result, the total emission perceived by an external observer can be perceived as a red or pink light in particular during operation of the optoelectronic component. In this case, the primary electromagnetic radiation can be at least partly or completely absorbed by the luminescent material and converted into a secondary electromagnetic radiation having a wavelength maximum of greater than or equal to 660 nm. The secondary electromagnetic radiation having a proportion of 50% relative to the total proportion of the secondary electromagnetic radiation can have a wavelength maximum of less than 660 nm. In accordance with a further embodiment, at least the luminescent material can be embedded into a matrix material. The embedding of the luminescent material into the matrix material can be embedded in a manner distributed homogeneously or with a concentration gradient. In particular, polymers or ceramic materials or glass are suitable as matrix material. By way of example, the matrix material can comprise or be an epoxy resin, polymethyl methacrylate (PMMA), polystyrene, glass, ceramic such as YAG or $Al_2O_3$, polycarbonate, polyacrylate, polyurethane or a silicone resin, such as, for instance, polysiloxane, or mixtures thereof.

In accordance with a further embodiment, the luminescent material can be embedded in a matrix material and be shaped as a potting, layer or film. The potting can, for example, be connected cohesively or a potting compound can be connected to a layer sequence having an active region. In this case, the potting compound can be polymer material, for example. In particular, this can be epoxy or silicone, a methyl-substituted silicone, for example, poly(dimethylsiloxane) and/or polymethylvinylsiloxane, a cyclohexyl-substituted silicone, for example, poly(dicyclohexyl)siloxane or a combination thereof.

Furthermore, the matrix material can additionally comprise a filler, such as, for example, a metal oxide, thus for instance titanium dioxide, silicon dioxide, zirconium dioxide, zinc oxide, aluminum oxide, and/or glass particles.

In accordance with one embodiment, the luminescent material can be shaped as particles or ceramic laminae and can at least partly scatter the primary electromagnetic radiation. The luminescent material can be embodied simultaneously as a luminous center that partly absorbs radiation of the primary electromagnetic radiation and emits a secondary electromagnetic radiation, and as a scattering center for the primary electromagnetic radiation. The scattering properties of the luminescent material can lead to an improved coupling out of radiation from the component. The scattering effect can, for example, also lead to an increase in the probability of absorption of primary radiation in the luminescent material, as a result of which a smaller layer thickness of the layer containing the luminescent material can be necessary.

In accordance with a further embodiment, the optoelectronic component can comprise an encapsulation including the layer sequence having the active region, wherein the luminescent material can be arranged in the beam path of the primary electromagnetic radiation within or outside the encapsulation. The encapsulation can in each case be embodied as a thin-film encapsulation.

In accordance with one embodiment, the luminescent material is in direct contact with the radiation source. In this regard, the conversion of the primary electromagnetic radiation into the secondary electromagnetic radiation can take place at least partly in proximity to the radiation source, for example, at a distance between luminescent material and radiation source of less than or equal to 200 preferably less than or equal to 50 µm (so-called "chip level conversion").

In accordance with one embodiment, the luminescent material is spaced apart from the radiation source. In this regard, the conversion of the primary electromagnetic radiation into the secondary electromagnetic radiation can at least partly take place at a large distance from the radiation source, by way of example at a distance between luminescent material and radiation source of greater than or equal to 200 preferably greater than or equal to 750 particularly preferably greater than or equal to 900 µm (so-called "remote phosphor conversion").

Exemplary embodiments A1, A2, A3 and A4 for producing the luminescent material are indicated below. The amounts of the starting substances are indicated here in g. The starting substances can be proportionally oxidized, i.e., for example, $Si_3N_4$ or AlN can contain corresponding amounts of surface area bound oxygen ($O_2$). This additional proportion of oxygen is not taken into account in the following indications of the amounts of the starting substances. In exemplary embodiments A1 to A4, europium oxide is used as activator. However, it is also possible to use other compounds of the lanthanides or of manganese, for example, oxides of the lanthanides or of manganese in corresponding amounts.

Exemplary embodiment A1:

2.1 g $SrCO_3$, 44.8 g $Sr_3N_2$, 1.2 g $SiO_2$, 12.8 g $Si_3N_4$, 0.7 g $Al_2O_3$, 7.5 g AlN and 3.5 g $Eu_2O_3$ are weighed in and homogenized. Afterward, the starting mixture is annealed for a number of hours under a reducing atmosphere in a tubular or chamber furnace at temperatures of between 1300° C. and 2000° C. After subsequent grinding and screening of the annealed cake, this results in at least one phase comprising the luminescent material, for example, as main phase.

Exemplary embodiment A2:

46.4 g $Sr_3N_2$, 9.3 g $Si_3N_4$, 12.3 g AlN and 3.5 g $Eu_2O_3$ are weighed in and homogenized. Afterward, the starting mixture is annealed for a number of hours under a reducing atmosphere in a tubular or chamber furnace at temperatures of between 1300° C. and 2000° C. After subsequent grinding and screening of the annealed cake, this results in at least one phase comprising the luminescent material, for example, as main phase.

Exemplary embodiment A3:

46.0 g $Sr_3N_2$, 13.8 g $Si_3N_4$, 8.1 g AlN and 3.4 g $Eu_2O_3$ are weighed in and homogenized. Afterward, the starting mixture is annealed for a number of hours under a reducing atmosphere in a tubular or chamber furnace at temperatures of between 1300° C. and 2000° C. After subsequent grinding and screening of the annealed cake, this results in at least one phase comprising the luminescent material, for example, as main phase.

Exemplary embodiment A4:

59.9 g $Sr_3N_2$, 7.5 g $Si_3N_4$ and 4.5 g $Eu_2O_3$ are weighed in and homogenized. Afterward, the starting mixture is annealed for a number of hours under a reducing atmosphere in a tubular or chamber furnace at temperatures of between 1300° C. and 2000° C. After subsequent grinding and screening of the annealed cake, this results in at least one phase comprising the luminescent material, for example, as main phase.

Figure 1:
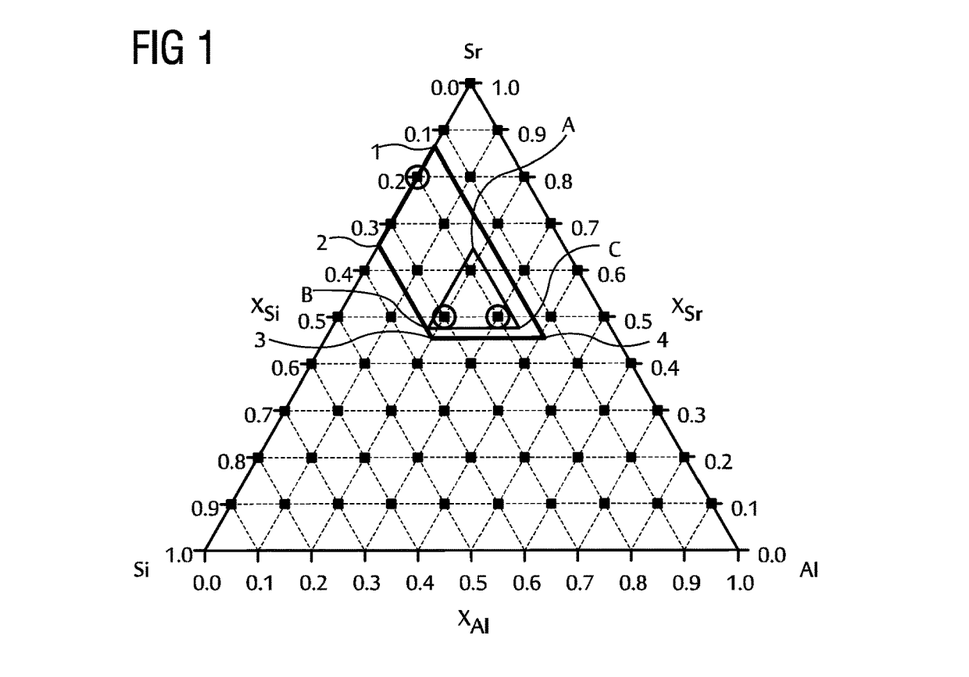
FIG. 1 schematically shows a ternary phase diagram of the mole fraction ratio of the first constituent in accordance with one embodiment.

FIG. 1 shows a ternary phase diagram of the mole fraction ratio of the first constituent comprising silicon (Si), strontium (Sr) and aluminum (Al). The doping with at least one element of the lanthanides, for example, europium and/or $Mn^{2+}$ and/or $Mn^{4+}$, is not shown here. The second constituent can be represented as a fourth dimension in the phase diagram. The O—N ratio is not depicted here and can be set by the choice of the starting substances. The equilateral triangle represents the concentration or mole fraction plane of the first constituents in the mixture of the starting substances. The sides of the equilateral triangle here denote the respective mole fraction of silicon ($x_{Si}$), strontium ($x_{Sr}$) and aluminum ($x_{Al}$). The sum of the individual mole fractions of the first constituent yields in total 1 or 100% or 100 mol %. The following formula holds true here: $x_{Al}+x_{Sr}+x_{Si}=1$. In the ternary phase diagram, a quadrilateral spanned by the vertices 1, 2, 3 and 4 indicates the mole fraction range of the mixture of the starting substances which leads to the production of the luminescent material. The triangle spanned by the vertices A, B and C shows the preferred mole fraction range for the production of the luminescent material. The vertices of the quadrilateral area show the mole fraction ratio of the first constituent as follows:

1: Si:Al:Sr=0.15:0:0.85,
2: Si:Al:Sr=0.35:0:0.65,
3: Si:Al:Sr=0.35:0.2:0.45, and
4: Si:Al:Sr=0.15:0.4:0.45.

The vertices of the triangular area show the mole fraction ratio of the first constituent as follows:

A: Si:Al:Sr=0.175:0.175:0.65,
B: Si:Al:Sr=0.35:0.175:0.475, and
C: Si:Al:Sr=0.175:0.35:0.475.

Figure 2:
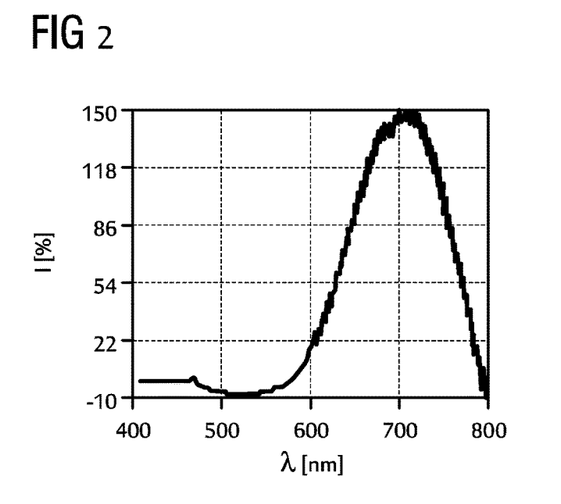
FIG. 2 shows emission spectra of one exemplary embodiment.

The first circular region in the ternary phase diagram marks the mole fraction ratio Si:Al:Sr=0.3:0.2:0.5 of the first constituent of the mixture of the starting substances, wherein the phase produced after method step B), comprising the luminescent material as main phase, emits in a wavelength range having an emission maximum of greater than 660 nm, for example, greater than 700 nm. This mole fraction ratio (first circular region) was produced according to exemplary embodiment A3. The associated emission spectrum is shown in FIG. 2.

Correspondingly, the second circular region for Si:Al:Sr=0.2:0.3:0.5 was produced according to exemplary embodiment A2.

Correspondingly, the third circular region for Si:Al:Sr=0.2:0:0.8 was produced according to exemplary embodiment A4.

Exemplary embodiment A1 is not shown in the ternary phase diagram, wherein A1 corresponds to exemplary embodiment A3 in the first constituent, but has a different O/N ratio.

FIG. 2 shows the emission spectrum of the luminescent material, wherein the intensity I in percent is represented as a function of the wavelength λ in nm. The luminescent material was produced in accordance with exemplary embodiment A3. The luminescent material presumably has the composition $(Sr_{1-a}Eu_a)_{3-x}(Al_bSi_{1-b})_2(O_cN_{1-c})_{6-y}$, where $0 \leq a \leq 1$ and $0 \leq b \leq 1$ and $0 \leq c \leq 1$ and $x \leq 3$ and $y \leq 6$. The excitation with primary electromagnetic radiation took place at 460 nm. It is evident from the emission spectra that the luminescent material has an emission maximum of 707 nm with a full width at half maximum of approximately 110 nm.

Figure 3A:
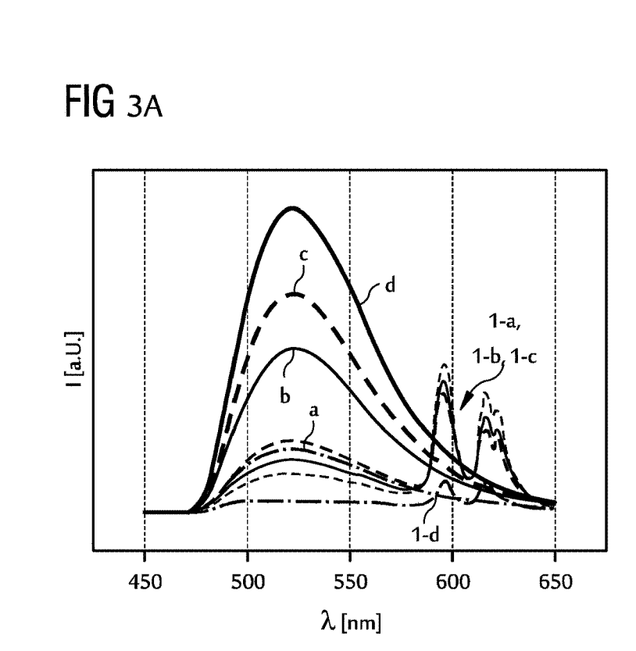
FIG. 3a shows emission spectra of comparative examples.

FIG. 3a shows comparatively emission spectra a to d of one comparative example $Sr_{3-x}Al_{2+x}O_6:Eu^{2+}$ where x=0.05 for a, x=0.2 for b, x=0.3 for c and x=0.4 for d, wherein the intensity I in a.U. (arbitrary units) is represented as a function of the wavelength k in nm. The excitation took place at 365 nm. This figure likewise shows the emission spectra of one comparative example $Sr_{3-x}Al_{2+x}(O_6:Eu^{3+}$ where x=0.05 for 1-a, x=0.2 for 1-b, x=0.3 for 1-c and x=0.4 for 1-d, wherein the excitation took place at 254 nm. Two emission wavelengths are mentioned in the figure. For the $Eu^{2+}$ emission (wide band), excitation was effected at 365 nm. In addition, FIG. 3a shows the relative intensity in a.U. (arbitrary units) of the luminescence as a function of x in the comparative example $Sr_{3-x}Al_{2+x}(O_6):Eu^{2+}$. The emission maximum of the comparative example $Sr_{3-x}Al_{2+x}(O_6):Eu^{2+}$ is approximately 525 nm with a full width at half maximum of 70 to 80 nm in the case of an excitation of 365 nm. The emission maximum of the $Eu^{3+}$ emission is approximately 590 nm in accordance with FIG. 3a. All these emission spectra show that the comparative example $Sr_{3-x}Al_{2+x}(O_6):Eu^{2+}$ has an emission maximum of less than or equal to 630 nm.

Figure 3B:
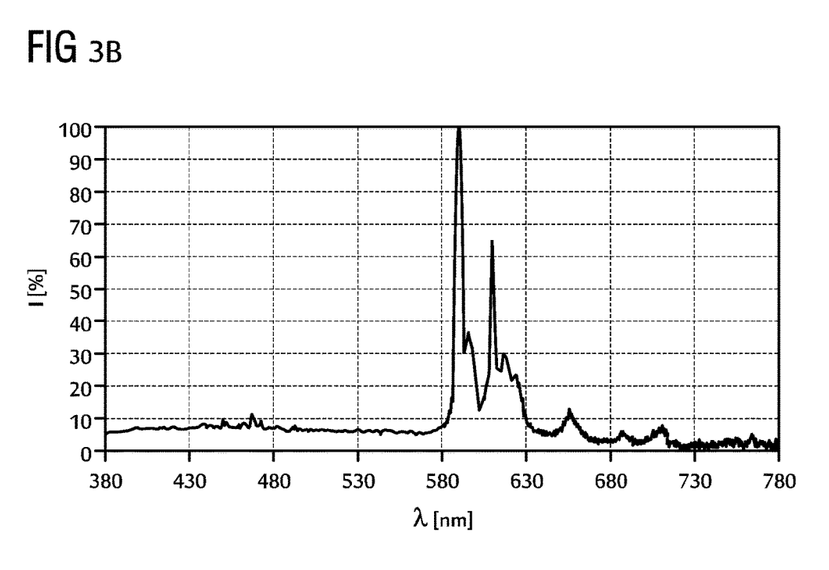
FIG. 3b shows emission spectra of one comparative example.

FIG. 3b shows an emission spectrum of one comparative example $Sr_3Al_2O_6:Eu^{3+}$. The emission maximum of the comparative example $Sr_{3-x}Al_2O_6:Eu^{3+}$ is approximately 590 nm.

Therefore, in comparison with the comparative examples $(Sr_{1-x}Eu_x)_3Al_2O_6$ (FIGS. 3a and 3b), the luminescent material (FIG. 2) exhibits a distinctly red-shifted wavelength range and has a greater full width at half maximum. It can be assumed that such a red shift results from a substitution of Al—O for Si—N in the luminescent material. A deficit in the Sr position is likewise presumed. This means that the Sr sites in the crystal lattice are not fully occupied, with the result that vacancies are present in the crystal lattice. In accordance with one embodiment, the structure of the luminescent material is related to the structure of $Sr_3Al_2O_6$ (Pa ISCD 71860).

Figure 3C:
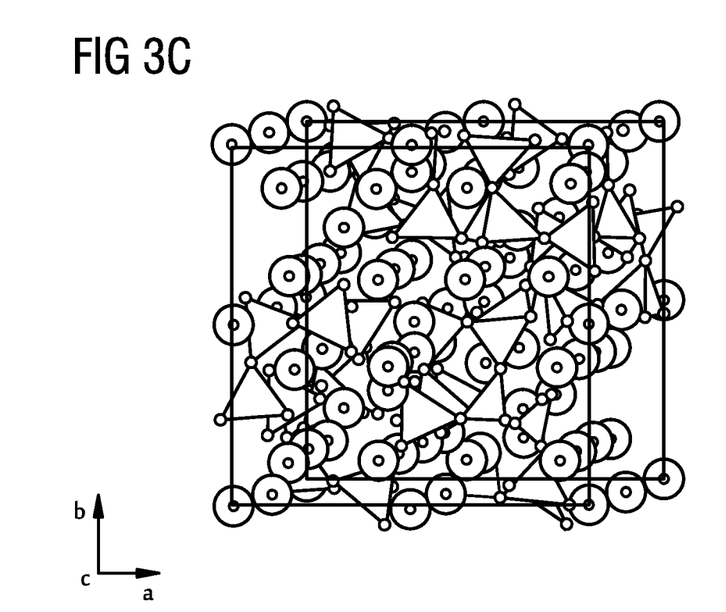
FIG. 3c shows an elementary cell of one comparative example.

FIG. 3c shows the spatial arrangement of $[AlO_2O_{2/2}]_6^{6-}$ units (left) and the elementary cell (right) of the comparative example $Sr_3Al_2O_6$. Isolated rings of six $[AlO_2O_{2/2}]_6^{6-}$ tetrahedra are present in the $Sr_3Al_2O_6$.

Figure 4:
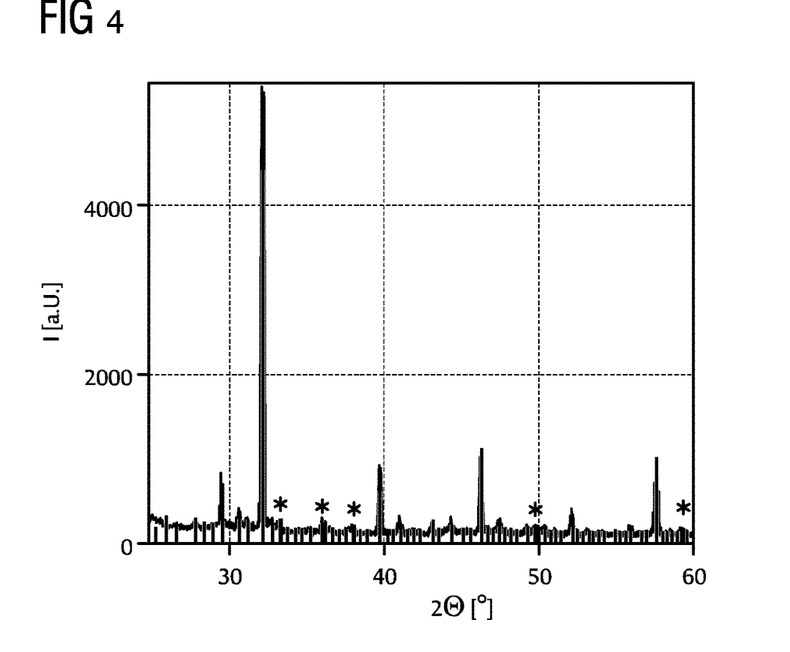
FIG. 4 shows an x-ray powder diffractogram of the luminescent material in accordance with one embodiment.

FIG. 4 shows an X-ray powder diffractogram of the luminescent material with the intensity I in percent as a function of 2θ in degrees. Here and hereinafter, the angle 2θ denotes the angle between radiation source, sample and detector. The luminescent material is structurally related to $Sr_3Al_2O_6$ (Pa $\bar{3}$, ISCD 71860). A refinement of the lattice parameters of the luminescent material succeeds in a cubic space group Pa-$\bar{3}$ or Pa $\bar{3}$. In this case, the lattice parameter fluctuates between approximately 15.5 Å and 15.9 Å with the composition and is thus always smaller than the lattice parameter of the comparative example, which has a value of 15.86 Å.

Figure 5:
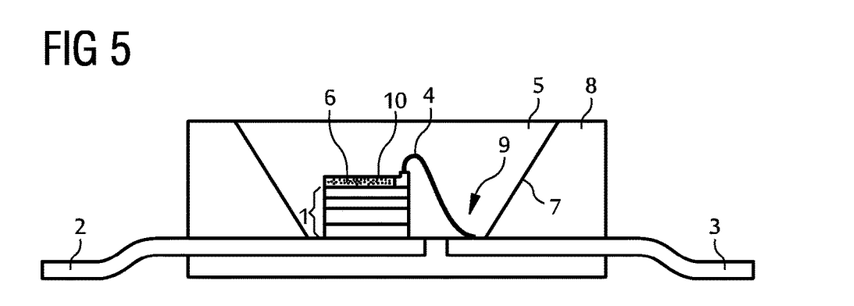
FIG. 5 shows the schematic side view of an optoelectronic component.

FIG. 5 shows a schematic side view of an optoelectronic component on the basis of the exemplary embodiment of a light-emitting diode (LED). The optoelectronic component comprises a layer sequence 1 having an active region (not explicitly shown), a first electrical connection 2, a second electrical connection 3, a bonding wire 4, a potting 5, a housing wall 7, a housing 8, a cutout 9, a luminescent material 6, and a matrix material 10. The layer sequence 1 having an active region, which layer sequence comprises the luminescent material 6, is arranged within the optoelectronic component, the potting 5 and/or the cutout 9. The first and second electrical connections 2, 3 are arranged below the layer sequence 1 having an active region. There is an indirectly and/or directly electrical and/or mechanical contact between the layer sequence 1 having an active region and the bonding wire 4 and between the layer sequence 1 having an active region and the first and/or the second electrical connection 2, 3.

Furthermore, the layer sequence 1 having an active region can be arranged on a carrier (not shown here). A carrier can be, for example, a printed circuit board (PCB), a ceramic substrate, a circuit board or a metal plate, e.g. aluminum plate. Alternatively, a carrierless arrangement of the layer sequence 1 is possible in the case of so-called thin-film chips.

The active region is suitable for emitting primary electromagnetic radiation in an emission direction. The layer sequence 1 having an active region can be based on nitride compound semiconductor material, for example. Nitride compound semiconductor material emits, in particular, primary electromagnetic radiation in the blue and/or ultraviolet spectral range. In particular, InGaN can be used as nitride compound semiconductor material, which has a primary electromagnetic radiation having a wavelength of 460 nm.

The luminescent material 6, which as shown here is present in particle form and is embedded in a matrix material 10, is arranged in the beam path of the primary electromagnetic radiation. The matrix material 10 is polymer or ceramic material, for example. In this case, the luminescent material 6 is arranged directly in direct mechanical and/or electrical contact on the layer sequence 1 having an active region.

Alternatively, further layers and materials, such as the potting, for example, can be arranged between the luminescent material 6 and the layer sequence 1 (not shown here).

Alternatively, the luminescent material 6 can be arranged indirectly or directly at the housing wall 7 of a housing 8 (not shown here).

Alternatively, it is possible for the luminescent material 6 to be embedded in a potting compound (not shown here) and to be shaped together with the matrix material 10 as a potting 5.

The luminescent material 6 at least partly converts the primary electromagnetic radiation into a secondary electromagnetic radiation. By way of example, the primary electromagnetic radiation is emitted in the blue spectral range of the electromagnetic radiation, wherein at least part of the primary electromagnetic radiation can be converted by the luminescent material 6 into a secondary electromagnetic radiation in the red spectral range of the electromagnetic radiation. Alternatively or additionally, further luminescent materials can be present, which have, for example a further secondary electromagnetic radiation in the green spectral range. The overall radiation emerging from the optoelectronic component is a superimposition of blue-emitting primary radiation and red- and green-emitting secondary radiation, wherein the total emission visible to the external observer is warm-white light.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for producing a luminescent material, the method comprising:
    producing a mixture of starting substances that comprise a first constituent and a second constituent,
    wherein the first constituent comprises the following:
        an element or a combination of elements (EA) of the 2nd main group of the periodic system, wherein the element is selected from the group consisting of magnesium (Mg), calcium (Ca), strontium (Sr), and barium (Ba),
        aluminum (Al),
        silicon (Si),
        wherein a mole fraction of the mixture of the starting substances has vertices A, B and C of a strained triangle in a ternary phase diagram:
        A: Si:Al:EA=0.175:0.175:0.66,
        B: Si:Al:EA=0.35:0.175:0475,
        C: Si:Al:EA=0.175:0.35:0.475; and
        at least one element of lanthanides and/or $Mn^{2+}$ and/or $Mn^{4+}$,
        wherein a proportion of the element of the lanthanides and/or $Mn^{2+}$ and/or $Mn^{4+}$ in the first constituent is greater than or equal to 0.001 mol % and less than or equal to 20 mol %,
    wherein the second constituent comprises the following:
        oxygen, wherein a proportion of the oxygen in the second constituent is greater than or equal to 0 mol % and less than or equal to 100 mol %,
        nitrogen, wherein a proportion of the nitrogen in the second constituent is greater than or equal to 0 mol % and less than or equal to 100 mol %,
    annealing the mixture at a temperature of at least 1300° C. under a reducing atmosphere,
    wherein at least one or a plurality of phases are obtained after the annealing,
    wherein at least one phase comprises a luminescent material,
    wherein the luminescent material comprises the following general composition:

$$(EA_{1-a}LA_a)_{3-x}(Al_b Si_{1-b})_2(O_c N_{1-c})_{6-y}$$

wherein EA is at least one element from the 2nd main group and LA is at least one element from the lanthanides and/or $Mn^{2+}$ and/or $Mn^{4+}$,
    wherein it holds true that: $0<a\leq 1$ and $0<b\leq 1$ and $0\leq c\leq 1$ and $x<3$ and $y<6$,
    wherein a x-ray powder diffractogram of the luminescent material is describable in the cubic space group $Pa\bar{3}$, and
    wherein the luminescent material absorbs at least part of a primary electromagnetic radiation in an UV range or a blue range and emits a secondary electromagnetic radiation having an emission maximum of greater than or equal to 660 nm.

2. The method according to claim 1, wherein the mixture of the starting substances further comprises a substance selected from the group consisting of hydrides, carbonates, nitrides, oxides, metals, and silicides, alloys and combinations thereof.

3. The method according to claim 1, wherein annealing is carried out from one to five times.

4. The method according to claim 1, wherein annealing includes a holding time between 1 minute and 24 hours.

5. The method according to claim 1, further comprising washing the phase or phases in alkaline solution and/or acid.

6. The method according to claim 1, wherein producing the mixture further comprises adding at least one flux.

7. The method according to claim 1, wherein the phase or phases not comprising the luminescent material emit no secondary electromagnetic radiation having a wavelength range of greater than or equal to 460 nm.

* * * * *

UNITED STATES PATENT AND TRADEMARK OFFICE
CERTIFICATE OF CORRECTION

PATENT NO. : 10,174,245 B2
APPLICATION NO. : 14/891596
DATED : January 8, 2019
INVENTOR(S) : Bianca Pohl-Klein Page 1 of 1

It is certified that error appears in the above-identified patent and that said Letters Patent is hereby corrected as shown below:

In the Claims

In Column 17, Line 43, Claim 1, delete "A: Si:Al:EA=0.175:0.175:0.66," and insert --A: Si : Al : EA = 0.175 : 0.175 : 0.65,--.

In Column 17, Line 44, Claim 1, delete "B: Si:Al:EA=0.35:0.175:0475," and insert --B: Si : Al : EA = 0.35 : 0.175 : 0.475,--.

Signed and Sealed this
Nineteenth Day of March, 2019

Andrei Iancu
*Director of the United States Patent and Trademark Office*